(12) United States Patent
Kruse et al.

(10) Patent No.: US 11,853,672 B2
(45) Date of Patent: Dec. 26, 2023

(54) INTEGRATED CIRCUIT DEVELOPMENT USING ADAPTIVE TILE DESIGN APPROACH FOR METAL INSULATOR METAL CAPACITOR INSERTION

(71) Applicant: International Business Machines Corporation, Armonk, NY (US)

(72) Inventors: Ryan Michael Kruse, Williamson, TX (US); Zhou Jin Dong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 17/386,976

(22) Filed: Jul. 28, 2021

(65) Prior Publication Data
US 2023/0031704 A1 Feb. 2, 2023

(51) Int. Cl.
*G06F 30/392* (2020.01)
*H01L 27/08* (2006.01)
*G06F 30/398* (2020.01)
*H01L 27/02* (2006.01)
*H01G 4/30* (2006.01)

(52) U.S. Cl.
CPC .......... *G06F 30/392* (2020.01); *G06F 30/398* (2020.01); *H01G 4/30* (2013.01); *H01L 27/0207* (2013.01); *H01L 27/0805* (2013.01)

(58) Field of Classification Search
CPC ...... G06F 30/39; G06F 30/392; G06F 30/396; G06F 30/398; H01G 4/30; H01L 27/0207; H01L 27/0805
USPC ......................................................... 716/119
See application file for complete search history.

(56) References Cited

U.S. PATENT DOCUMENTS

| | | | |
|---|---|---|---|
| 6,591,408 | B1 | 7/2003 | Asahina |
| 7,761,831 | B2 | 7/2010 | Mai et al. |
| 7,869,275 | B2 | 1/2011 | Grant et al. |
| 8,161,450 | B2 | 4/2012 | Huynh et al. |
| 10,546,094 | B2 | 1/2020 | Arp et al. |
| 2014/0282340 | A1* | 9/2014 | Sundareswaran ..... G06F 30/392 716/122 |
| 2020/0243502 | A1 | 7/2020 | Kim |

FOREIGN PATENT DOCUMENTS

JP 2001175699 A 6/2001

* cited by examiner

*Primary Examiner* — Paul Dinh
(74) *Attorney, Agent, or Firm* — CANTOR COLBURN LLP; Kelsey M. Skodje

(57) ABSTRACT

Aspects of the invention include configuring an initial tile with a plurality of portions, placing the initial tile at a location of the integrated circuit, and overlaying a clock mesh placement at the location. One or more of the plurality of portions of the initial tile that overlap with the clock mesh placement are determined, and the initial tile is modified, based on the determining the one or more of the plurality of portions, to generate a final tile. A design of the integrated circuit is finalized for fabrication based on using the final tile at the location, the final tile representing a plate of a metal insulator metal capacitor (MIMCAP).

20 Claims, 5 Drawing Sheets

INTEGRATED CIRCUIT DEVELOPMENT USING ADAPTIVE TILE DESIGN APPROACH FOR METAL INSULATOR METAL CAPACITOR INSERTION

BACKGROUND

The present invention generally relates to integrated circuit development, and more specifically, to integrated circuit development using an adaptive tile design approach for metal insulator metal capacitor (MIMCAP) insertion.

The development of an integrated circuit (i.e., chip) includes several phases from the initial design to fabrication. Integrated circuits typically include several metal layers with interconnection among the layers being achieved through vias. Generally, higher layers use thicker wires that result in faster transmission of signals. The routing phase of integrated circuit development generally includes balancing the use of these thicker (i.e., higher layer) wires that facilitate faster interconnection with thinner (i.e., lower layer) wires that keep the higher layers from becoming too congested and suffering from interference. At the later stages of development (e.g., after placement of the components and routing of the interconnects), MIMCAPs may be added throughout the chip for general decoupling.

SUMMARY

Embodiments of the present invention are directed to integrated circuit development using an adaptive tile design approach for MIMCAP insertion. A non-limiting example computer-implemented method includes configuring an initial tile with a plurality of portions, placing the initial tile at a location of the integrated circuit, and overlaying a clock mesh placement at the location. The method also includes determining one or more of the plurality of portions of the initial tile that overlap with the clock mesh placement and modifying the initial tile, based on the determining the one or more of the plurality of portions, to generate a final tile. A design of the integrated circuit is finalized for fabrication based on using the final tile at the location, the final tile representing a plate of a metal insulator metal capacitor (MIMCAP).

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, MIMCAPs may be added throughout the integrated circuit at later stages of development for general decoupling. MIMCAPs may be added between routing layers and, more specifically, between the higher ultra thick metal (UTM) layers. These UTM layers also tend to be used for clock meshes. A clock mesh is a homogeneous shorted grid of metal that is driven by many clock drivers. Clock meshes are sensitive to additional capacitive coupling from MIMCAP plates over or under the wire routes. The effect may be increased power consumption (i.e., capacitive loading on the clock meshes) that may limit chip performance.

Embodiments of the invention relate to integrated circuit development using an adaptive tile design approach for MIMCAP insertion. The approach facilitates placement of the MIMCAPs and the clock meshes at the UTM layers while avoiding interaction between them. The adaptive tile, representing a potential design of the MIMCAP, is placed at one location at a time or chip-wide, and portions of the tile that overlap with clock signals are removed. In this way, the resulting MIMCAP is assured not to interact with any clock meshes. The adaptive tile design approach may be repeated in the UTM layers at a ground-to-ground pitch in each direction in a step-and-repeat pattern or altogether, as detailed.

Figure 1:
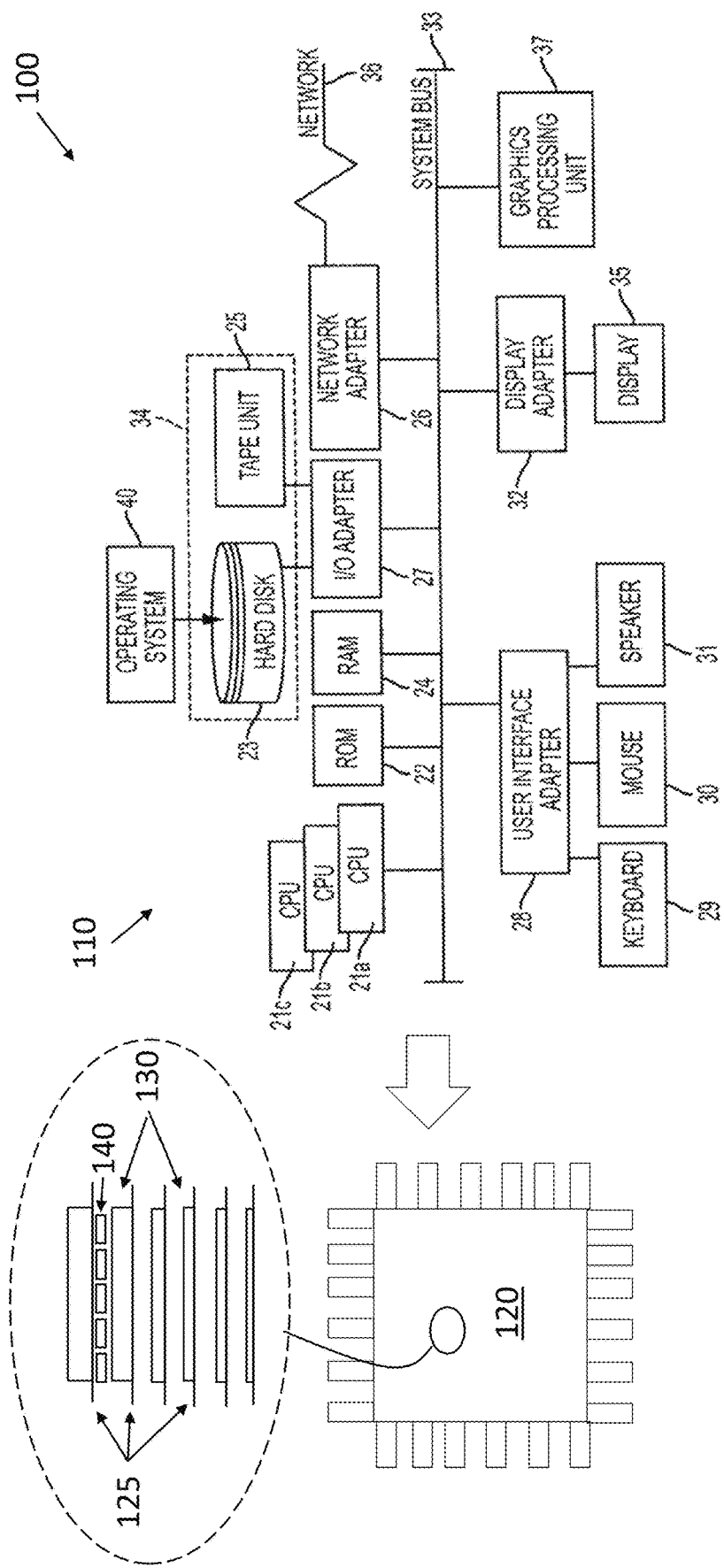
FIG. 1 is a block diagram of a system to perform the development of an integrated circuit using an adaptive tile design approach for metal insulator metal capacitor (MIMCAP) insertion according to one or more embodiments of the invention.

FIG. 1 is a block diagram of a system 100 to perform the development of an integrated circuit 120 using an adaptive tile design approach for MIMCAP insertion according to one or more embodiments of the invention. The expanded view of a portion of the integrated circuit 120 shows exemplary layers 125 of metal tracks (i.e., wires) 130. As shown, the thickness of the metal tracks 130 increases in the higher layers (according to the orientation shown in FIG. 1) and the highest layers 125 are UTM layers 125. As previously noted, MIMCAPs 140 are placed between UTM layers 125. As detailed with reference to FIGS. 2-4, an adaptive tile design approach is used to size the MIMCAPs 140 so that they do not overlap with clock lines 330 (FIG. 3). Specifically, an initial tile 200 (FIG. 2) is modified by breaking off portions 220, 230 (FIG. 2) that overlap with clock lines 330.

The system 100 includes a processing system 110 used to generate the design that is ultimately fabricated into the integrated circuit 120. The steps involved in the fabrication of the integrated circuit 120 are well-known and briefly described herein. Once the physical layout is finalized, based, in part, on selection of a via mesh specification among universally routable via mesh specifications developed according to embodiments of the invention, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 5.

The processing system 110 has one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 110.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 110 can be stored in mass storage 34. The RAM 22, ROM 24, and mass storage 34 are examples of memory 19 of the processing system 110. A network adapter 26 interconnects system bus 33 with an outside network 36 enabling the processing system 110 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 110 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 110 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in processing system 110.

Figure 2:
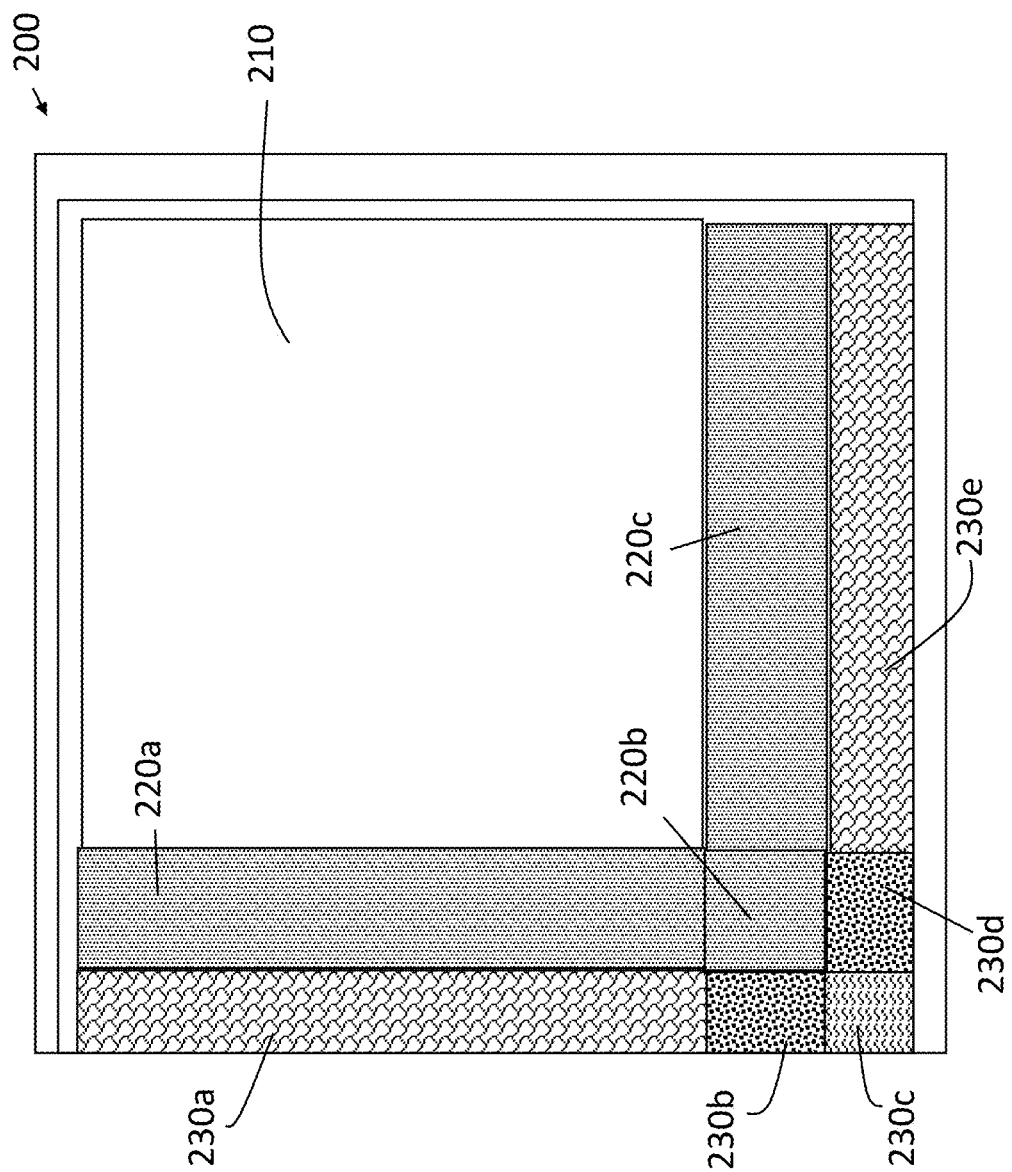
FIG. 2 is a block diagram of an initial tile used in the adaptive tile design approach according to one or more embodiments of the invention.
Figure 3:
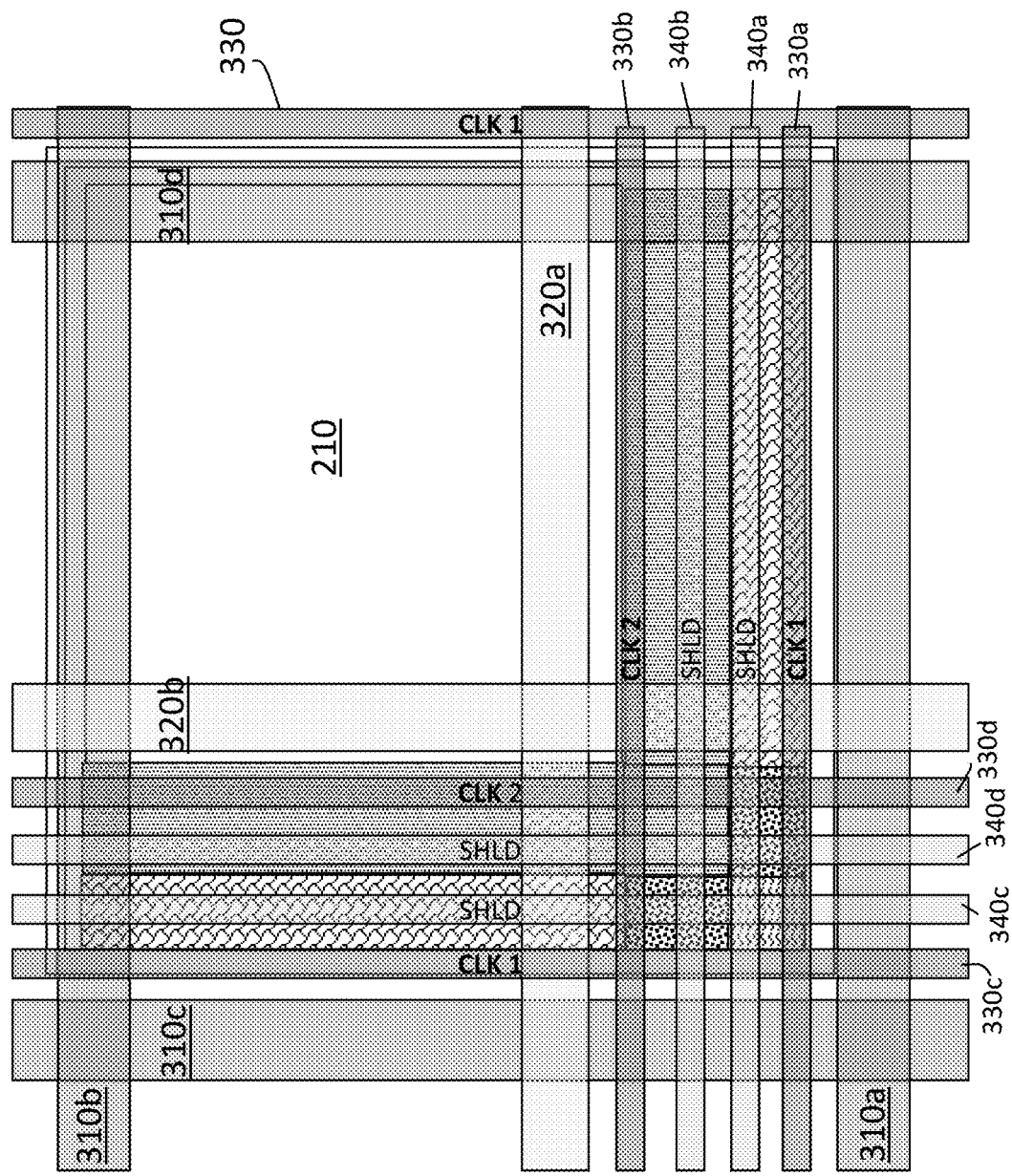
FIG. 3 illustrates a clock mesh overlay on the initial tile as part of the adaptive tile design approach according to one or more embodiments of the invention.

FIG. 2 is a block diagram of an initial tile 200 used in the adaptive tile design approach according to one or more embodiments of the invention. The initial tile 200 represents an initial size of conductive plates of the MIMCAP 140 that will be fabricated according to the processes detailed with reference to FIG. 4. The MIMCAP 140 generally includes two conductive plates with a dielectric layer therebetween. By using the adaptive tile design approach, according to one or more embodiments of the invention, to size the conductive plates of the MIMCAP 140, the MIMCAP 140 is assured not to interact with clock lines 330 of the clock mesh that traverse the same layer 125 as the MIMCAP 140.

Figure 4:
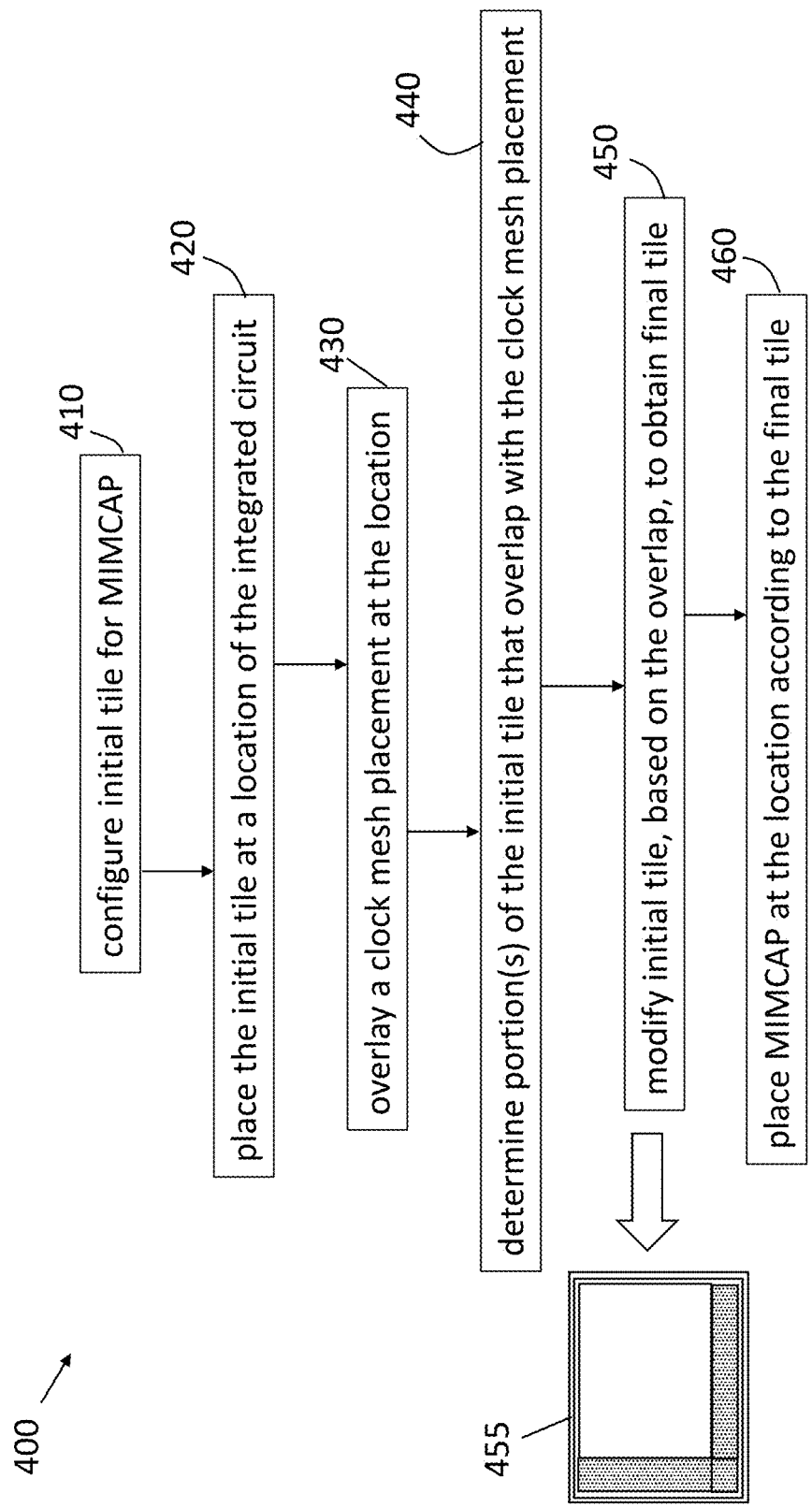
FIG. 4 is a process flow of a method of using an adaptive tile design approach for MIMCAP insertion according to one or more embodiments of the invention.

The initial tile 200 includes different portions 210, 220a, 220b, 220c, generally referred to as 220, and 230a through 230e, generally referred to as 230, as indicated. The portion 210 is a minimum size of a MIMCAP plate that is required to meet a design rule check (DRC). DRCs are performed at a foundry and must be passed in order to proceed to fabrication of the integrated circuit 120. The portions 230 are along outer edges of the initial tile 200, and the portions 220 are along inner edges of the initial tile 200, as compared with the portions 230. As discussed with reference to FIG. 3, the placement of clock lines 330 at the location of the integrated circuit 120 at which the MIMCAP 140 is placed determines which portions 220, 230 may be removed from the initial tile 200. Generally, if clock lines 330 are only placed to overlap with (outer) portions 230, then some or all of the portions 230 may have to be removed from the initial tile 200. However, if clock lines 330 are placed to overlap with some or all of the (inner) portions 220, then not only the effected portions 220 but also some or all of the portions 230 must be removed to result in the final tile 455 (FIG. 4). That is, when portions 220, 230 of the initial tile 200 are removed to avoid an overlap with one or more clock lines 330, the removal cannot result in a discontinuous tile as the final tile 455.

FIG. 3 illustrates a clock mesh overlay on the initial tile 200 as part of the adaptive tile design approach according to one or more embodiments of the invention. The labels for the different portions 210, 220, 230 of the initial tile 200 that are shown in FIG. 2 are used with reference to FIG. 3. The initial tile 200 placement is defined by ground tracks 310a and 310b, which are parallel to each other, and ground tracks 310c and 310d, which are parallel to each other. Power tracks 320a and 320b are indicated along with clock lines 330. Specifically, clock lines 330a and 330b are parallel to ground tracks 310a and 310b. Each of the clock lines 330a, 330b is associated with a respective shield 340a, 340b. Similarly, clock lines 330c and 330d are parallel to ground tracks 310c and 310d. Each of the clock lines 330c, 330d is associated with a respective shield 340c, 340d.

As a comparison of FIGS. 2 and 3 indicates, clock lines 330a and 330c overlap with portions 230 of the initial tile 200, and clock lines 330b and 330d overlap with portion 220. If only clock lines 330a and/or 330c (i.e., the clock lines 330a, 330c closest to the ground tracks 310a, 310c)

were present, then only corresponding portions 230 of the initial tile 200 along the outer edges of the initial tile 200 would have to be removed to define the final tile 455 (FIG. 4). Specifically, if only clock line 330*a* and the corresponding shield 340*a* were placed as shown and none of the other clock lines 330 were present, then portions 230*c*, 230*d*, and 230*e* would be removed from the initial tile 200 while portions 210, 220, 230*a*, and 230*b* are retained as the final tile 455. Similarly, if only clock line 330*c* and the corresponding shield 340*c* were placed as shown and none of the other clock lines 330 were present, then portions 230*a*, 230*b*, and 230*c* would be removed from the initial tile 200 while portions 210, 220, 230*d*, and 230*e* are retained as the final tile 455. If both clock lines 330*a* and 330*c* were present, all portions 230 would be removed, and the final tile 455 would retain portions 210 and 220. This final tile 455 would define the size of the conductive plates of the MIMCAP 140 as well as the position within the location defined by the ground tracks 310*a*, 310*b*, 310*c*, and 310*d*.

However, if either or both of the clock lines 330*b*, 330*d* (i.e., the clock lines 330*b*, 330*d* farthest from the ground tracks 310*a*, 310*c*) is present, then, regardless of the presence of clock lines 330*a* or 330*c*, some or all of both the portions 220 and 230 of the initial tile 200 would have to be removed to generate a final tile 455. Specifically, if only the clock line 330*b* and corresponding shield 340*b* were present, then portions 220*b* and 220*c* would have to be removed and, additionally, portions 230*b*, 230*c*, 230*d*, and 230*e* would also have to be removed to obtain the final tile 455. Similarly, if only the clock line 330*d* and corresponding shield 340*d* were present, then portions 220*a* and 220*b* would have to be removed and, additionally, portions 230*a*, 230*b*, 230*c*, and 230*d* would also have to be removed to obtain the final tile 455. If both clock lines 330*b* and 330*d* are present, then all portions 220 and 230 must be removed to obtain the final tile 455, regardless of whether clock lines 330*a* and 330*c* are present. That is, to avoid interaction between the MIMCAP 140 and the clock lines 330*b* and/or 330*d*, the corresponding portions 220 must be removed, but this requires removal of the adjacent portions 230, as well, as previously noted. When both clock lines 330*b* and 330*d* are placed, the resulting final tile 445 would include only portion 210 and would ensure that the MIMCAP 140 whose conductive plates will have the size and location of the portion 210 indicated in FIG. 3 will not interfere with any clock lines 330.

FIG. 4 is a process flow of a method 400 of using an adaptive tile design approach for MIMCAP insertion according to one or more embodiments of the invention. The processes discussed for the method 400 may be performed iteratively for one initial tile 200 at a time. Alternately, the method 400 may be implemented once to size all the MIMCAPs. At block 410, configuring an initial tile 200 for a MIMCAP 140 (i.e., for an initial size of the MIMCAP 140) includes defining different portions 210, 220, 230, as shown in FIG. 2. If the method 400 is performed once for all MIMCAPs, then a number of initial tiles 200 are configured at block 410.

At block 420, placing the initial tile 200 at a location of the integrated circuit facilitates overlaying a clock mesh placement at the location, at block 430, as illustrated in FIG. 3. The placement, at block 420, involves selecting a particular location between UTM layers 125. As discussed with reference to FIG. 3, the location may be defined by ground tracks 310. Thus, in the case where the method 400 is performed for all the MIMCAPs together, the location of each initial tile 200 may be according to a ground pitch (i.e., each initial tile 200 is located adjacent to a ground track 310 in rows).

At block 430, overlaying the clock mesh placement at the location of the initial tile(s) 200 facilitates determining which portions 220, 230 of the (or each) initial tile 200 overlap with the clock mesh placement (i.e., location of the clock line(s) 330). At block 450, each initial tile 200, in turn according to an iterative approach or in the same process flow according to an alternate approach, is modified. At block 450, modifying the initial tile 200 is based on the overlap with the clock line(s) 330, as discussed with reference to FIG. 3 and may result in removal of one or more portions 220, 230 to result in the final tile 455, as shown.

In the exemplary final tile 455 shown, the portions 210, 220 remain. At block 460, placing a MIMCAP 140 at the location of the initial tile 200 according to the final tile 445 refers to sizing the conductive plates of the MIMCAP 140 in accordance with the final tile 455 while maintaining the location of the original initial tile 200. As previously noted, the fabricated integrated circuit 120 includes the MIMCAPs 140 between layers 125. Each of these MIMCAPs 140 is sized and located according to the method 400.

While scaling the MIMCAPs 140 to account for clock lines 330 is specifically discussed, the MIMCAPs 140 could additionally be scaled to account for other types of signals according to the processes shown in FIG. 4.

Figure 5:
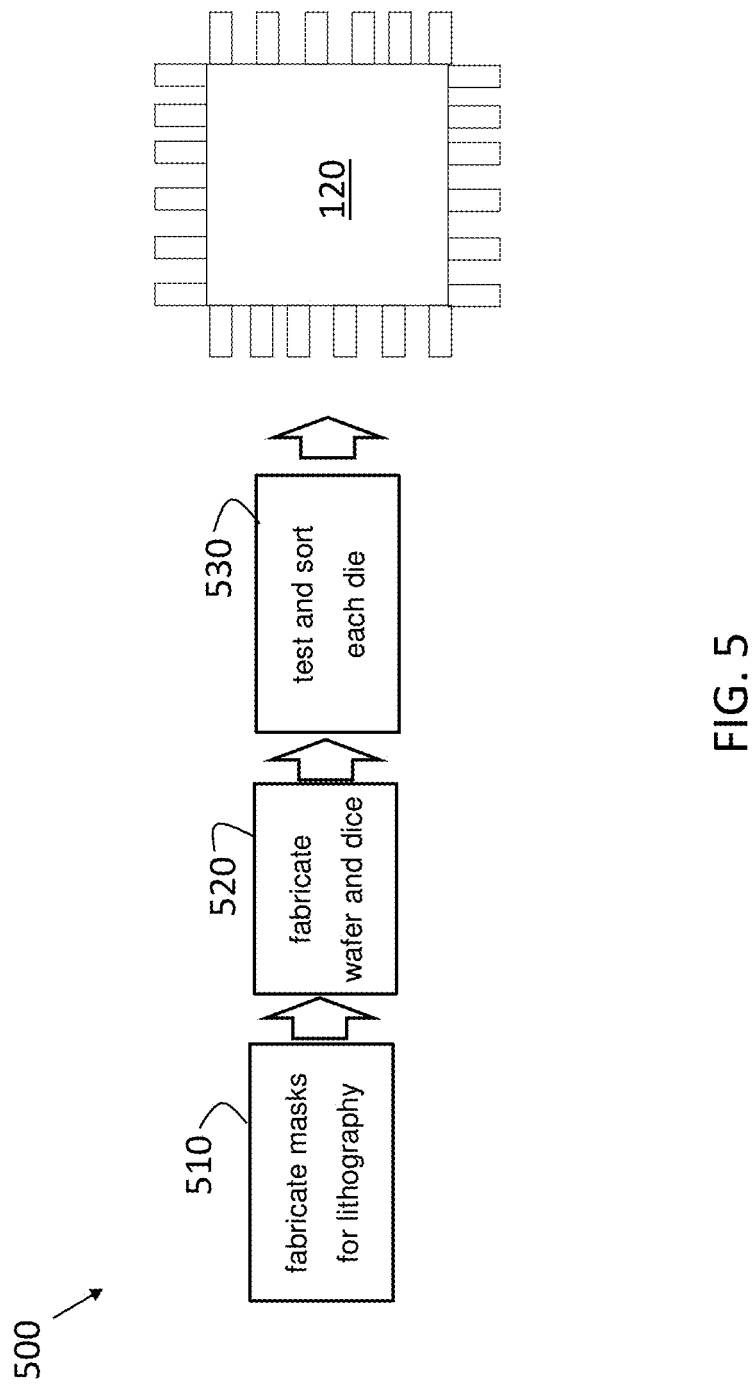
FIG. 5 is a process flow of a method of fabricating the integrated circuit according to exemplary embodiments of the invention.

FIG. 5 is a process flow of a method 500 of fabricating the integrated circuit according to exemplary embodiments of the invention. Once the physical design data is obtained, based, in part, on the processes discussed with reference to FIG. 4, the integrated circuit 120 can be fabricated according to known processes that are generally described with reference to FIG. 5. Generally, a wafer with multiple copies of the final design is fabricated and cut (i.e., diced) such that each die is one copy of the integrated circuit 120. At block 510, the processes include fabricating masks for lithography based on the finalized physical layout. At block 520, fabricating the wafer includes using the masks to perform photolithography and etching. Once the wafer is diced, testing and sorting each die is performed, at block 530, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of developing an integrated circuit, the computer-implemented method comprising:
    configuring an initial tile with a plurality of portions;
    placing the initial tile at a location of the integrated circuit;
    overlaying a clock mesh placement at the location;
    determining one or more of the plurality of portions of the initial tile that overlap with the clock mesh placement;
    modifying the initial tile, based on the determining the one or more of the plurality of portions, to generate a final tile; and
    finalizing a design of the integrated circuit for fabrication based on using the final tile at the location, the final tile representing a plate of a metal insulator metal capacitor (MIMCAP).

2. The computer-implemented method according to claim 1, wherein the placing the initial tile includes defining the location by ground tracks.

3. The computer-implemented method according to claim 2, wherein the overlaying the clock mesh placement includes overlaying one or two clock lines of the clock mesh in parallel with two of the ground tracks.

4. The computer-implemented method according to claim 3, wherein the modifying the initial tile includes breaking off the one or more of the plurality of portions of the initial tile based on overlap with the one or two clock lines.

5. The computer-implemented method according to claim 1, wherein the placing the initial tile and the overlaying the clock mesh placement to modify the initial tile is performed iteratively at a different location of the integrated circuit per iteration.

6. The computer-implemented method according to claim 1, wherein the placing the initial tile and the overlaying the clock mesh placement to modify the initial tile is performed for different locations of the integrated circuit at once.

7. The computer-implemented method according to claim 1, further comprising retaining at least a minimum portion among the plurality of portions of the initial tile as the final tile, wherein the minimum portion passes a design rule check required to fabricate the integrated circuit.

8. A system for developing an integrated circuit comprising:
    a memory having computer readable instructions; and one or more processors for executing the computer readable instructions, the computer readable instructions controlling the one or more processors to perform operations comprising:

configuring an initial tile with a plurality of portions;

placing the initial tile at a location of the integrated circuit;

overlaying a clock mesh placement at the location;

determining one or more of the plurality of portions of the initial tile that overlap with the clock mesh placement;

modifying the initial tile, based on the determining the one or more of the plurality of portions, to generate a final tile; and finalizing a design of the integrated circuit for fabrication based on using the final tile at the location, the final tile representing a plate of a metal insulator metal capacitor (MIMCAP).

9. The system according to claim 8, wherein the placing the initial tile includes defining the location by ground tracks.

10. The system according to claim 9, wherein the overlaying the clock mesh placement includes overlaying one or two clock lines of the clock mesh in parallel with two of the ground tracks.

11. The system according to claim 10, wherein the modifying the initial tile includes breaking off the one or more of the plurality of portions of the initial tile based on overlap with the one or two clock lines.

12. The system according to claim 8, wherein the placing the initial tile and the overlaying the clock mesh placement to modify the initial tile is performed iteratively at a different location of the integrated circuit per iteration.

13. The system according to claim 8, wherein the placing the initial tile and the overlaying the clock mesh placement to modify the initial tile is performed for different locations of the integrated circuit at once.

14. The system according to claim 8, further comprising retaining at least a minimum portion among the plurality of portions of the initial tile as the final tile, wherein the minimum portion passes a design rule check required to fabricate the integrated circuit.

15. A computer program product comprising a computer readable storage medium having program instructions embodied therewith, the program instructions executable by a processor to cause the processor to perform operations comprising:

configuring an initial tile with a plurality of portions;

placing the initial tile at a location of the integrated circuit;

overlaying a clock mesh placement at the location;

determining one or more of the plurality of portions of the initial tile that overlap with the clock mesh placement;

modifying the initial tile, based on the determining the one or more of the plurality of portions, to generate a final tile; and finalizing a design of the integrated circuit for fabrication based on using the final tile at the location, the final tile representing a plate of a metal insulator metal capacitor (MIMCAP).

16. The computer program product according to claim 15, wherein the placing the initial tile includes defining the location by ground tracks.

17. The computer program product according to claim 16, wherein the overlaying the clock mesh placement includes overlaying one or two clock lines of the clock mesh in parallel with two of the ground tracks.

18. The computer program product according to claim 17, wherein the modifying the initial tile includes breaking off the one or more of the plurality of portions of the initial tile based on overlap with the one or two clock lines.

19. The computer program product according to claim 15, wherein the placing the initial tile and the overlaying the clock mesh placement to modify the initial tile is performed iteratively at a different location of the integrated circuit per iteration or the placing the initial tile and the overlaying the clock mesh placement to modify the initial tile is performed for different locations of the integrated circuit at once.

20. The computer program product according to claim 15, further comprising retaining at least a minimum portion among the plurality of portions of the initial tile as the final tile, wherein the minimum portion passes a design rule check required to fabricate the integrated circuit.

\* \* \* \* \*